United States Patent [19]
Nair et al.

[11] Patent Number: 6,090,149
[45] Date of Patent: Jul. 18, 2000

[54] SYSTEM AND METHOD FOR DETECTING FLOATING NODES WITHIN A SIMULATED INTEGRATED CIRCUIT

[75] Inventors: Vijayakumaran V. Nair, Austin; Ronald D. Holifield, Kyle, both of Tex.

[73] Assignee: Advanced Micro Devices, Inc., Sunnyvale, Calif.

[21] Appl. No.: 09/026,297

[22] Filed: Feb. 19, 1998

Related U.S. Application Data

[60] Provisional application No. 60/037,415, Feb. 21, 1997.

[51] Int. Cl.[7] .................................................. G06F 17/50
[52] U.S. Cl. .............................................. 703/14; 703/20
[58] Field of Search ................... 395/500.34, 500.35, 395/500.36; 703/14, 20

[56] References Cited

U.S. PATENT DOCUMENTS

| | | | |
|---|---|---|---|
| 5,379,231 | 1/1995 | Pillage et al. | 364/488 |
| 5,410,549 | 4/1995 | Hamano | 371/23 |
| 5,706,223 | 1/1998 | Tani | 364/578 |
| 5,774,411 | 6/1998 | Hsieh et al. | 365/230.06 |
| 5,872,717 | 2/1999 | Yu et al. | 364/489 |

OTHER PUBLICATIONS

Verilog–XL Reference Manual, vol. 1, "Compilation and Execution Compiler Directives," pp. 23–18 to 23–19, Version 1.6, Mar. 1991, Cadence Design Systems, Inc.

Tuinenga, P., *SPICE: A Guide to Circuit Simulation & Analysis Using Pspice*, Prentice Hall, Englewood Cliffs, New Jersey, 1988, pp. xv–xviii and pp. 186.

*Primary Examiner*—Kevin J. Teska
*Assistant Examiner*—Thai Phan
*Attorney, Agent, or Firm*—Conely, Rose & Tayon, P.C.; Dan R. Christen

[57] ABSTRACT

A method and apparatus for detecting floating transistor gates within a netlist model of an integrated circuit is disclosed. All transistor gates and input nodes coupled to the transistor gates are identified. These input nodes are then used to generate a resistor card. The resistor card is used in conjunction with the original netlist during simulation to couple two resistors to each input node. The first resistor is coupled between the input node and a high potential, and the second resistor is coupled between the input node and a lower potential. The resistors may be configured to have equal resistance values. The resistance values may be large enough to ensure that the current conducted through the resistors will be minimal in relation to the currents in the circuit when the input node is not floating. The resistance values may be small enough to overcome any leakage currents present in the circuit. The two resistors operate in combination to pull the input node to a voltage level near the midpoint between the higher and lower potentials. This midpoint voltage level turns on transistors having control terminals coupled to the input node and may consequently produces a relatively large current between the power supply and ground. This large current is easily detectable from the simulation output and may be used to locate which, if any, gates may have floating inputs that cause large static currents.

8 Claims, 4 Drawing Sheets

SYSTEM AND METHOD FOR DETECTING FLOATING NODES WITHIN A SIMULATED INTEGRATED CIRCUIT

PRIORITY CLAIM

This application claims the benefit of U.S. Provisional Application Ser. No. 60/037,415 entitled "System And Method For Detecting Floating Nodes Within A Simulated Integrated Circuit," filed Feb. 21, 1997.

BACKGROUND OF THE INVENTION

1. Field of the Invention

This invention relates to the simulation of an integrated circuit's operation prior to the manufacture of the circuit and, more particularly, to detecting floating nodes (or transistor gates) within a netlist of nodes representing the circuit.

2. Description of the Related Art

Integrated circuits are highly complex and must be tested during production to ensure high quality and reliability. One of many tests which may be performed is a test of the current drawn by the circuit while in a static mode. This test may be referred to as a static current test or IDDQ test. The IDDQ test entails applying a power supply to the circuit and putting the circuit into an IDDQ test mode state (e.g., by clocking selected inputs for a predetermined time period and then waiting for the circuit to settle into the desired state). Once the circuit is in the IDDQ test mode state, current readings are taken between the power supply and ground.

When integrated circuits are production tested, large IDDQ values are often indicative of process failures. This is particularly true for CMOS circuits which typically have very small IDDQ values. Thus IDDQ values are often used for quality screening to eliminate potentially unreliable parts before they are sold. However, the usefulness of IDDQ values for quality screening may be undermined when an integrated circuit has a large IDDQ value due to floating transistor gates that are part of the design, i.e., not due to a process failure. For this reason, it is advantageous to design an IDDQ test mode into the integrated circuit that properly disables all analog circuitry, dynamic logic, and other circuitry that might cause current to flow, e.g., transistors whose control terminals (or "gates") are not tied to a power supply or ground (i.e., "floating"). Note that control terminals holding a decayed capacitive charge and not coupled to any power supplies or ground are considered to be floating transistor gates.

However, when designing an IDDQ test mode it is no simple task to eliminate all floating transistor gates or guarantee that all such transistors will not provide a current path from VCC to ground (or VSS). This is in part due to the large number of transistors involved in modern integrated circuits and the independent or block-oriented nature of the design process. For these reasons, a method for easily detecting floating transistor gates at the design stage is needed.

One possible solution is software modeling. Most integrated circuits can be modeled in software. Various software languages and circuit simulation applications (e.g., SPICE and Star-SIM™) currently exists for that purpose. Using these languages and applications, a list of nodes and components between nodes can be fashioned. These lists are often referred to as "netlists." Using a netlist, circuit simulation applications can be used to determine if the integrated circuit being designed will function according to specifications. If a failure is detected, the circuit design can be modified prior to embodying the circuit upon silicon. Modeling and simulating an integrated circuit in software advantageously minimizes the time and cost associated with producing a viable integrated circuit.

However, using software to identify with certainty which transistor gates or nodes, if any, are floating is difficult because of inherent limitations within the simulation software. For these reasons, a method for easily detecting floating nodes in a netlist is desired. Furthermore, it would also be desirable for the method to work regardless of whether the netlist represents an analog, digital, or mixed-signal integrated circuit.

SUMMARY OF THE INVENTION

The problems outlined above are in large part solved by a method for detecting floating transistor gates within a netlist in accordance with the present invention. In one embodiment, the method comprises identifying each unique input node within the netlist that is coupled to a transistor gate. These input nodes are then used to generate a resistor netlist or "card." The resistor card is used in conjunction with the original netlist during circuit simulation to couple two resistors to each unique input node. The first resistor is coupled between the input node and a high potential, e.g., the positive terminal of a power supply. The second resistor is coupled between the input node and a lower potential, e.g., the negative terminal of a power supply or ground. The resistors may be configured to have equal resistance values. The resistance values may also be large enough to ensure that the current conducted through the resistors will be minimal in relation to the current drawn through a transistor when the gate's input node is floating. The two resistors operate in combination to pull the input node to a voltage level near the midpoint between the high and low potentials (e.g., between power supply and ground voltage levels) when the input node is floating (i.e., not driven to a high or low potential). The resistance values may be low enough to ensure that the midpoint voltage is reached, regardless of any leakage currents in the circuit. This midpoint voltage level turns on both transistors in the gate and consequently produces a relatively large current between the power supply and ground. Advantageously, this large current is easily detectable from the simulation output and may be used to locate which, if any, transistor gates are floating.

In an alternative embodiment, the resistors connected to the identified nodes (and the power supply and ground which feed those resistors) may be separated into a second database. As a result, currents detected through the source-drain path of the transistors may be easily distinguished from currents read through the resistors. Advantageously, this embodiment allows circuits with an extremely large number of gates to be simulated without losing the ability to easily discern which currents are attributable to floating transistor gates and which currents are attributable to the added resistors.

Also contemplated is a method of modeling floating transistor gates within an integrated circuit simulation application. In one embodiment the method comprises receiving a netlist circuit model of an integrated circuit as input. The netlist may comprise a plurality of nodes, some of which may be connected to transistor gates. The netlist is searched to identify any unique input nodes. Unique input nodes are single instances of nodes that are connected to one or more transistor gates. Finally, two resistors are connected to each identified unique input node. The first resistor is coupled between the input node and a low potential. The second resistor is coupled between the input node and a high potential. Advantageously, floating transistor gates may be easily detected during circuit simulation by the large currents they will conduct.

An apparatus for determining static current failures within an integrated circuit modeled as a netlist is also contemplated. In one embodiment the apparatus comprises a plurality of transistors and nodes contained within a netlist, a power supply and ground, a plurality of resistors, and a current meter. The power supply and ground are coupled to the plurality of transistors according to the netlist. The resistors are divided into two groups, i.e., pull-up resistors and pull-down resistors. Pull-up resistors are coupled between the power supply and a number of selected nodes, while pull-down resistors are coupled between ground and the selected nodes, wherein the selected nodes are unique nodes coupled to the control terminals (i.e., gates) of one or more transistors. The current meter is coupled between the power supply and ground and is used to determine if current flowing between the power supply and ground is greater than a pre-defined limit indicative of static current failure.

Another method contemplated comprises scanning a netlist to detect unique input nodes that are coupled to control terminals of transistors, wherein the netlist may comprise analog, mixed-signal, and digital components. Next, the netlist is modified by attaching electrical components to any detected unique input nodes. The electrical components (which may be resistors or other components in combination with or without resistors) are configured to force the unique input nodes to a middle voltage if and only if the unique input nodes are floating.

BRIEF DESCRIPTION OF THE DRAWINGS

Other objects and advantages of the invention will become apparent upon reading the following detailed description and upon reference to the accompanying drawings in which.

Figure 1:
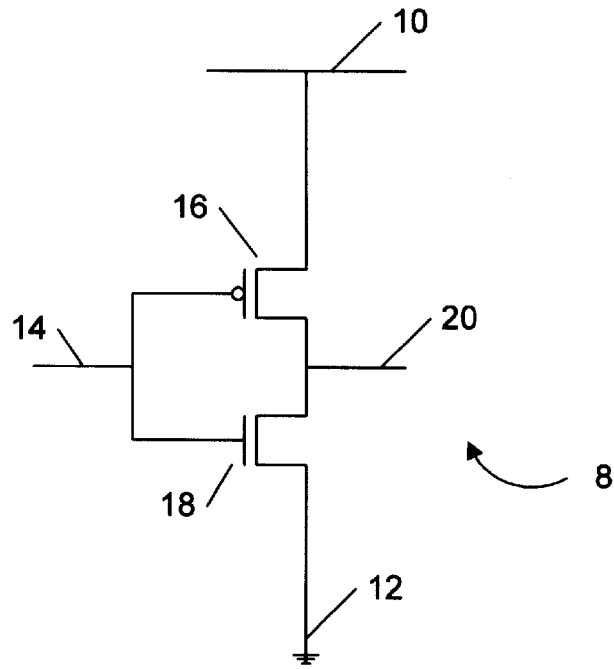
FIG. 1 is a circuit diagram illustrating an exemplary logic gate from a netlist.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to FIG. 1, an exemplary logic gate 8 from a netlist is shown. Logic gate 8 comprises two transistors 16 and 18. Transistors 16 and 18 are coupled to each other, to output 20, and to terminals 10 and 12, respectively. During static operation, terminal 10 is coupled to a voltage VCC. Similarly, terminal 12 is coupled to a voltage VSS, wherein VCC is greater than VSS. The control terminals (or "gates") of transistors 16 and 18 are coupled to input node 14. As is evident from the figure, a high voltage level (i.e., a voltage roughly equal to VCC) at input node 14 will turn transistor 16 off and transistor 18 on. Thus output 20 will be coupled to VSS. In contrast, a low voltage level (i.e., a voltage level roughly equal to VSS) at input node 14 will turn transistor 16 on and transistor 18 off, thereby coupling output 20 to VCC. Thus, both high and low voltage levels at input node 14 result in a definite high or low voltage level at output 20. If, however, the voltage at input node 14 is allowed to "float" or remain at a voltage level at least one threshold above VSS and at least one threshold below VCC, both transistors 16 and 18 may partially or fully turn on. This may allow a relatively large current to flow from VCC to VSS through the source-drain paths of transistors 16 and 18. Note that input node 14 need not be physically disconnected from other gates to be floating. For example, input node 14 may float if it is coupled to the output of a tri-state buffer in high impedance state.

As previously noted, circuit simulation software is ill-suited for detecting floating transistor gates. Instead of simulating floating transistor gates, most software tends to force a floating input to either VCC or VSS. To remedy this problem, inputs that are not being driven may be forced to a voltage between VCC and VSS. For example, the inputs may be forced to a middle voltage near (VCC+VSS)/2 when they are floating. This forces both transistors 16 and 18 to turn on, thereby resulting in a relatively large current passing from VCC to VSS through transistors 16 and 18. This large current may be easily detected in the output of the circuit simulation software and thus may be used to easily identify floating transistor gates within the netlist. Note as used herein the term middle voltage refers to any voltage capable of turning both transistors 16 and 18 on.

Figure 2:
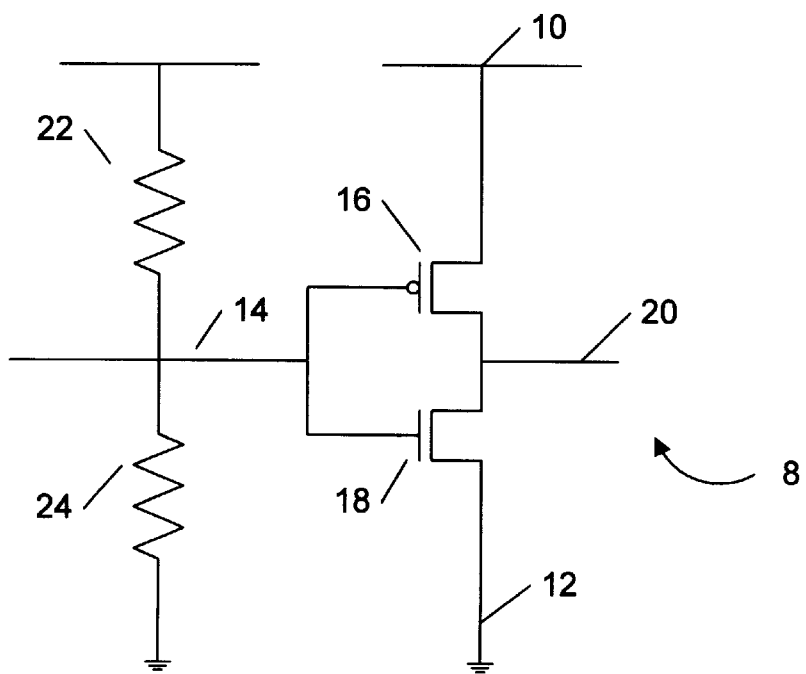
FIG. 2 is a circuit diagram illustrating one possible method for forcing input nodes to a middle voltage by adding resistors.

Turning now to FIG. 2, one possible method for forcing input nodes to a middle voltage is shown. In this embodiment, two resistors 22 and 24 are added to each unique input node in the circuit (in this example, input node 14). Resistor 22 is coupled between input node 14 and VCC, while resistor 24 is coupled between input node 14 and VSS. Resistors 22 and 24 are configured to have equal resistance values, which may be high (e.g., $1 \times 10^9$ ohms) so that they will have a minimal effect upon transistors 16 and 18 when input node 14 is not floating, i.e., during normal circuit operation. A high resistor value may be particularly beneficial when the integrated circuit being simulated contains any analog or mixed-signal circuitry that may be sensitive to current and voltage changes. In one embodiment, the resistance value chosen is high enough to have minimal effect upon transistors 16 and 18 when input node 14 is not floating, yet low enough to guarantee that input node 14 will reach the desired voltage level regardless of any leakage currents in the circuit. Note other methods of forcing input nodes to a middle voltage may be possible. For example, it might be possible to use other electrical components (e.g., resistors with different resistance values, capacitors, inductors, active components such as power supplies, current sources and voltage sources) either alone or in combination with resistors 22 and 24 to drive input node 14 to a middle voltage when input 14 is floating.

Figure 3:
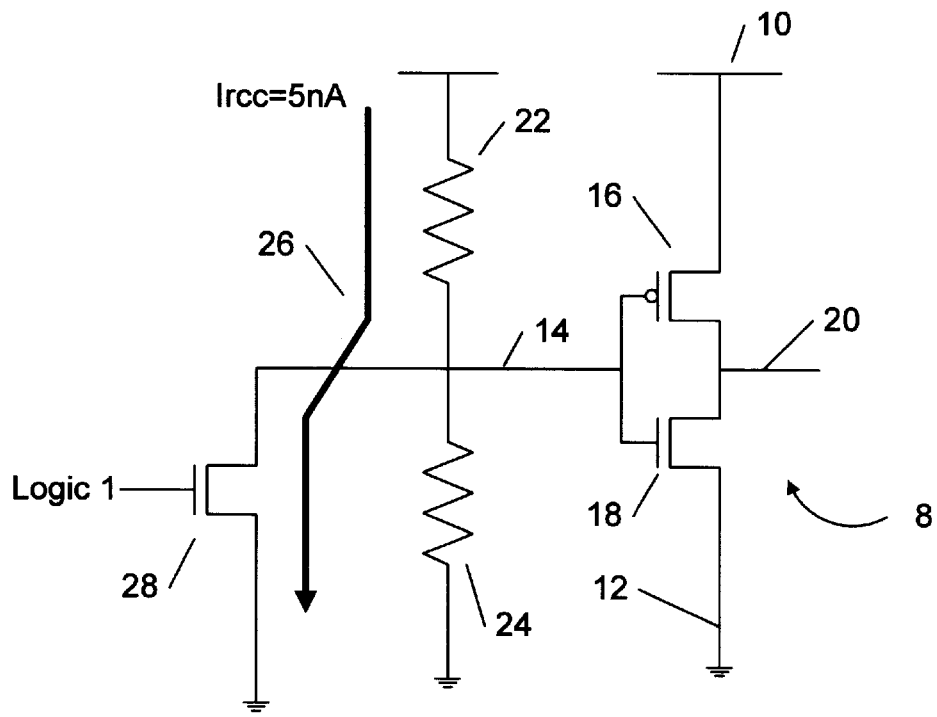
FIG. 3 is a circuit diagram illustrating the effect additional resistors have upon a logic gate whose input node is not floating.

Turning now to FIG. 3, the effect resistors 22 and 24 have upon a gate whose input is not floating is shown. In this example, input node 14 is pulled low by a transistor 28, which is coupled to input node 14 of logic gate 8. As shown in the figure, when transistor 28 is turned on, input node 14 is coupled to VSS. Assuming VCC is 5.0 volts greater than VSS and resistors 22 and 24 are equal to $1 \times 10^9$ ohms, an Ircc current of approximately 5 nA (indicated by line 26) should flow from VCC to VSS through resistor 22 and transistor 28. In most circuits, a current of this magnitude will have no effect upon logic gate 8, it transistors 16 and 18, or the remainder of the circuit.

Figure 4:
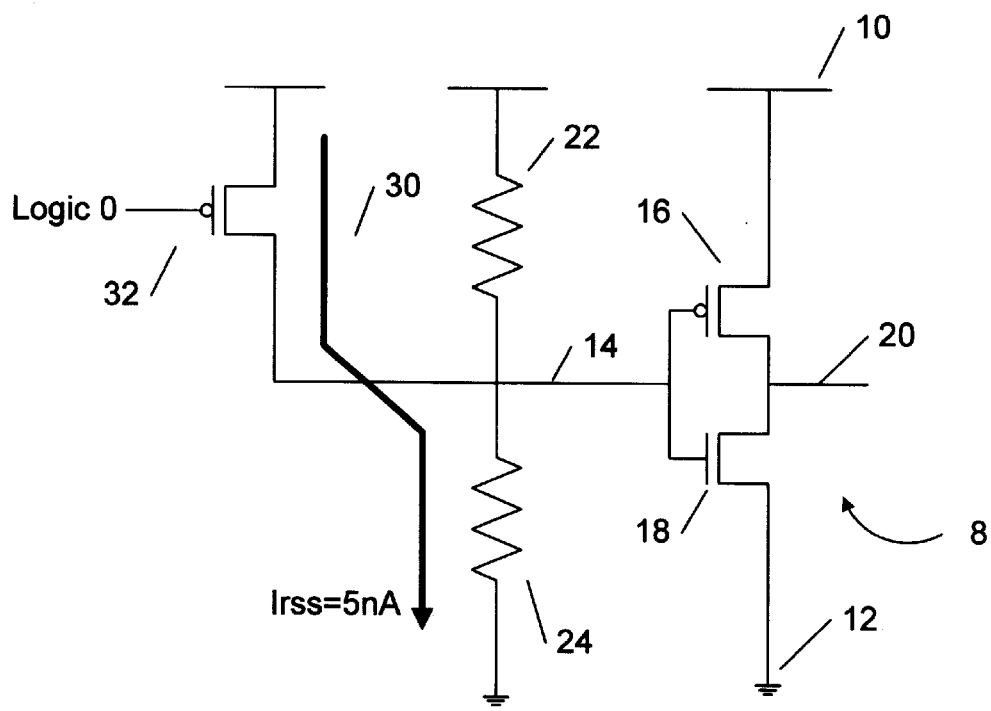
FIG. 4 is another circuit diagram illustrating the effect additional resistors have upon a logic gate whose input node is not floating.

Turning now to FIG. 4, the effect resistors 22 and 24 have upon a logic gate whose input is not floating is shown. In this example, input node 14 is pulled high by a transistor 32, which is coupled between input node 14 of logic gate 8 and VCC. As shown in the figure, when transistor 32 is turned on, input node 14 is coupled to VCC. Assuming once again that VCC is 5.0 volts greater than VSS and that resistors 22 and 24 are both equal to $1 \times 10^9$ ohms, an Irss current of approximately 5 nA (indicated by line 30) should flow from VCC to VSS through transistor 32 and resistor 24. As previously noted, in most circuits a current of this magnitude will have no effect upon the logic gate, its transistors, or the remainder of the circuit.

Figure 5:
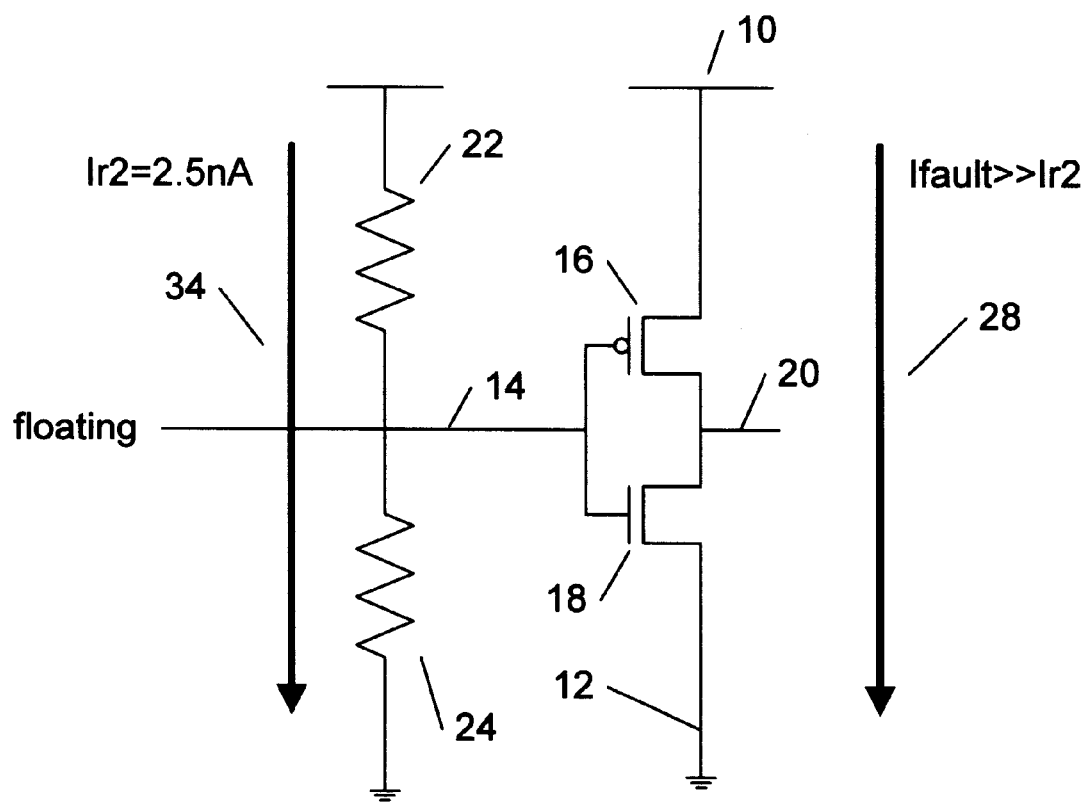
FIG. 5 is a circuit diagram illustrating the effect additional resistors have upon a logic gate whose input node is floating.

Turning now to FIG. 5, the effect resistors 22 and 24 have upon a gate whose input is floating is shown. In this example, input node 14 is floating, i.e., it is neither coupled to VCC nor VSS. Assuming VCC is five volts greater than VSS and resistors 22 and 24 are equal to $1 \times 10^9$ ohms, an Ir2 current of approximately 2.5 nA (indicated by line 34) should flow from VCC to VSS through resistors 22 and 24. As the five volt potential drop will be divided equally across resistors 22 and 24, input node 14 will be held at a middle potential of 2.5 volts above VSS and 2.5 volts below VCC. This voltage level operates to turn on both transistors 16 and 18. As a result, a relatively large $I_{fault}$ current (in relation to Ir2) will pass from VCC to VSS through transistors 16 and 18.

Figure 6:
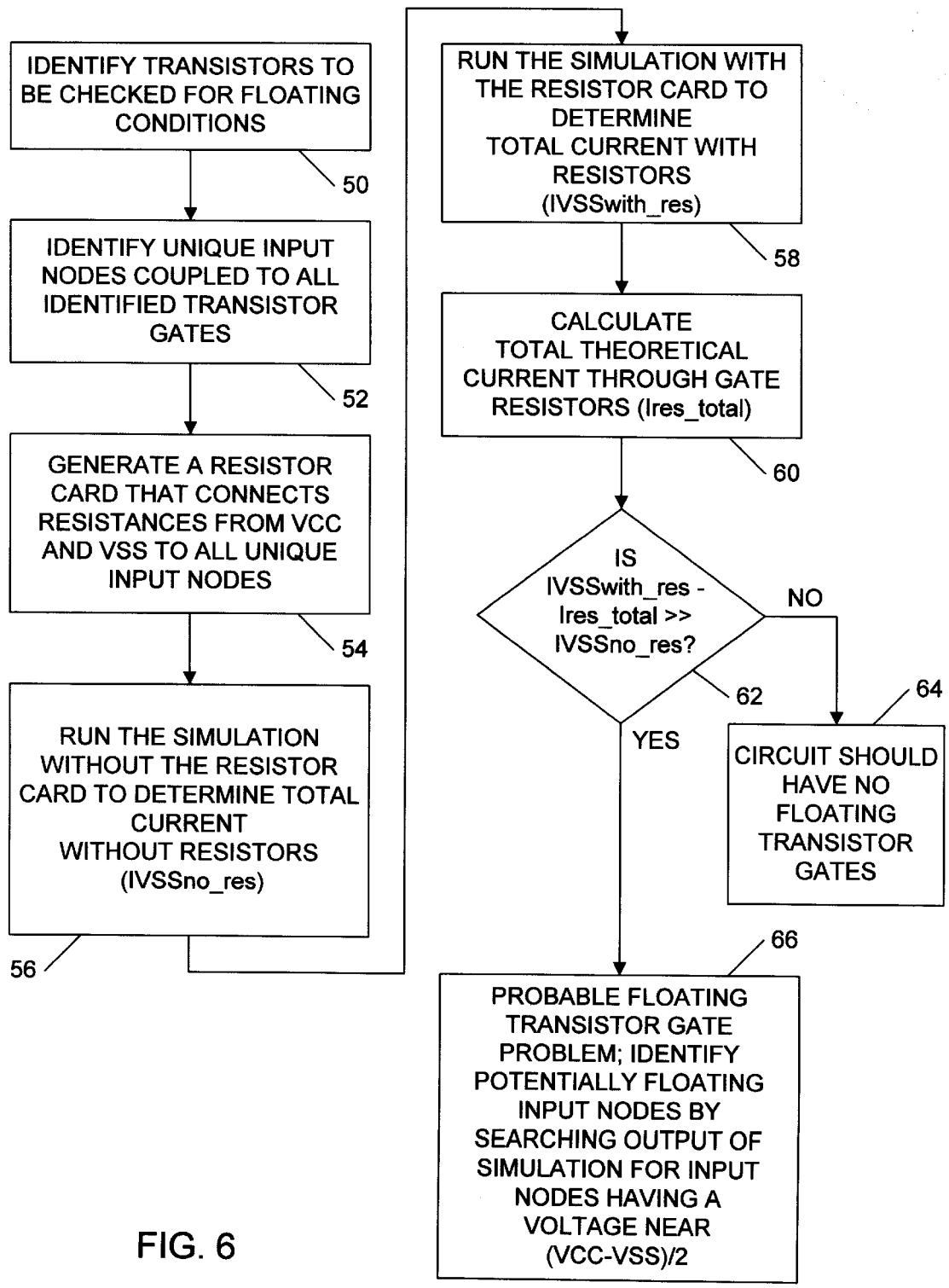
FIG. 6 is a flowchart illustrating one possible embodiment of the contemplated method for detecting floating transistor gates in a netlist.

Turning now to FIG. 6, a flowchart illustrating one possible embodiment of the contemplated method for detecting floating transistor gates is shown. As the figure illustrates, all transistors are identified from the netlist that represents the circuit to be modeled (step 50). The input nodes coupled to each transistor gate are then identified (step 52). In some cases, the initial or "normal" netlist representing the circuit may be in hierarchical form, e.g., a top-level circuit may incorporate sub-circuits that in-turn incorporate other lower-level circuits. These hierarchical netlists may be translated into a "flat" netlist to simplify the identification of nodes that are connected to transistor gates.

The identified input nodes may then be stored to a nodelist, which may then be used to generate a resistor netlist or resistor "card" for use with the normal netlist during circuit simulation (step 54). Note that the nodelist may be modified so that any nodes occurring more than once (caused by some nodes having more than one transistor gate coupled to them) are reduced to only one "unique" instance in the nodelist. This ensures that only one set of resistors are connected to each input node, regardless of how many transistor gates are connected to the input node. For example, even if four gates transistors are coupled to an input node, the input node should still only receive one set of resistors. Attached in Appendix A is an exemplary source code file entitled "add_icc_r.c" written in the C programming language. The program add_icc_r.c is configured to search a logfile, substitute node names from a flat netlist for the hierarchical names, and create a resistor card as output. The resistor card is configured to be used with a hierarchical netlist compatible with the circuit simulation program Star-SIM.

Once the resistor card has been generated, the circuit simulation program is run. Advantageously, the method disclosed may be used with most circuit simulation programs, including SPICE and Star-SIM. The circuit simulation program is first run using the normal netlist without the resistor card attached (step 56). By measuring the total current output from the voltage source supplying VCC, a baseline static or total current without resistors (IVSSno_res) can be determined. The simulation is run a second time with the resistor card connected (step 58). By measuring the total current output from the voltage source supplying VCC, a static or total current with resistors (IVSSwith_res) can be determined. A third current (Ires_total) can be calculated using the following formula (step 60):

$$I_{res}\_total = ((VCC-VSS)/\text{resistance of resistors in resistor card}) \times (\text{number of identified unique input nodes})$$

Ires_total represents the theoretical current through all of the added resistors assuming there are no floating transistor gates.

Once the three currents are known, a comparison can be made (step 62) to determine whether connecting the resistor card resulted in increased current through one or more gates. This comparison is performed by subtracting Ires_total (the current through the resistors) from IVSSwith_res (the total power supply current flowing into the netlist when coupled to the resistor card). If (IVSSwith_res−Ires_total) is approximately equal to IVSSno_res, then there are most likely no floating transistor gates within the circuit (step 64). However, if (IVSSwith_res−Ires_total) is much greater than IVSSno_res, then there is likely a floating transistor gate problem within the circuit (step 66).

Advantageously, attaching the resistor card forces the input node voltages of floating transistor gates to a midpoint voltage that guarantees both transistors in the logic gate will turn on. However, the resistors themselves will also conduct a certain amount of current (Ires_total) that may easily be calculated. Thus Ires_total may be subtracted from the measured current IVSSwith_res to determine the adjusted total current (Iadj) with guaranteed voltage levels at any floating inputs.

To determine which nodes within the circuit may be floating, the output file of the simulation performed with the resistor card attached may be searched for nodes having a voltage near (VCC−VSS)/2 (step 66). In some instances, floating nodes may settle at a voltage exactly equal to (VCC−VSS)/2, which may make them easier to identify. Attached in Appendix B is an exemplary C source code file entitled "gate_flt.c" which may be used to search for nodes in a Star-SIM output file that have a voltage between 2 and 3 volts.

Note that the steps illustrated in the figure are for exemplary purposes only and may be performed in varying sequences, in parallel (e.g., step 56 may be performed before or in parallel with step 54), or recursively on sub-blocks of the integrated circuit. Further note that the programs attached herein are merely exemplary and that they may be modified or enhanced to operate in different implementations. For example, the program gate_flt.c may be enhanced to ignore floating transistor gates within dynamic logic gates that are properly disabled. This is advantageous because floating transistor gates are only a problem in an IDDQ test mode if they open a current path from VCC to VSS. For example, even if three inputs to a four-input NAND gate are floating, a path from VCC to VSS will not open if the fourth input is grounded. Furthermore, simulation languages and tools may be combined to further reduce simulation time.

For example, Verilog could be used to generate output vectors for use as a starting point by Star-SIM.

In some situations the circuit may be too large to search by hand. In such a case, the circuit may be divided into blocks, and the current calculations may be repeated for each block (reducing the number of nodes with gates in the Ires_total calculation accordingly). Once a block is determined to have too much static current, the output file search may be limited to nodes within that block. Advantageously, some circuit simulation applications allow the sub-block calculations and measurements to be performed within the full integrated circuit simulation. For example, Star-SIM allows the source current flowing into each sub-block to be measured without actually separating the sub-blocks from the full integrated circuit.

In another embodiment, the resistors added to the circuit may be coupled to a separate power supply. For example, half of the added resistors (i.e., the pull-up resistors) may be coupled between input nodes and VCC', wherein VCC' is a voltage generated by a second power supply separate from the power supply generating VCC. Similarly, the second half of the added resistors (i.e., the pull-down resistors) may be coupled between input nodes and VSS' (i.e., the second power supply's lower potential terminal or ground). This configuration may advantageously allow the second power supply and the resistors to be grouped separately in the simulation program's output. This separation may allow currents from the second power supply, i.e., currents through resistors 22 and 24, to be easily distinguished from currents through the source-drain path of transistors within a logic gate. Advantageously, this embodiment may allow circuits with an extremely large number of logic gates to still be modeled without losing the ability to easily discern which currents are attributable to floating input nodes and which currents are attributable to the added resistors.

A method for detecting floating nodes within an integrated circuit modeled as a netlist has been disclosed. Although the embodiments above have been described in considerable detail, other versions and variations are possible and contemplated. Numerous variations and modifications will become apparent to those skilled in the art once the above disclosure is fully appreciated. It is intended that the following claims be interpreted to embrace all such variations and modifications.

What is claimed is:

1. A method for detecting floating transistor gates within an integrated circuit modeled as a netlist comprising:

identifying a plurality of unique input nodes within the netlist, wherein each of the unique input nodes is coupled to one or more corresponding transistor gates, and wherein the plurality of unique input nodes includes both floating and non-floating nodes;

generating a resistor card using the unique input nodes, wherein the resistor card comprises a plurality of resistors configured to be connected between the unique input nodes and a power supply, wherein the power supply has a high potential terminal and ground terminal;

using a circuit simulation application to stimulate the netlist and resistor card;

measuring the total static current flowing into the circuit with the resistors; and detecting if the current is above a pre-defined limit.

2. The method as recited as claim 1, wherein the detecting comprises:

using the circuit simulation application to stimulate the netlist without the resistor card;

measuring the total current flowing into the circuit without the resistor card;

calculating a theoretical current through the resistors in the resistor card;

subtracting the theoretical current from the total current with the resistor card to form an adjusted total current; and comparing the adjusted total current with the total current without the resistor card.

3. The method as recited in claim 2, further comprising:

generating an output file comprising voltage levels for a plurality of unique input nodes within the netlist with the resistor card attached; and identifying which of the plurality of transistor gates are floating by searching the output file for nodes having a voltage level near the arithmetic mean of the voltage at the high potential terminal and the ground terminal.

4. The method as recited in claim 3, wherein using the circuit simulation application to stimulate the netlist comprises:

connecting the high and low potential terminals of the power supply to the netlist;

providing any clock signals necessary to force the circuit into a desired test state;

stopping the clock signals; and waiting for the circuit to settle into a static state.

5. The method as recited in claim 3, wherein generating the resistor card comprises configuring the plurality of resistors such that two resistors are configured to be connected to each unique input node, wherein one resistor is configured to be connected between each unique input node and the higher potential terminal of the power supply, and wherein one resistor is configured to be connected between each unique input node and the lower potential terminal of the power supply.

6. The method as recited in claim 5, wherein the resistance values are selected to be large enough to ensure that the resistors will have minimal effect upon the circuit when the input nodes are not floating, and wherein the resistance values are selected to be small enough to generate the desired midpoint voltage level regardless of any leakage currents.

7. The method as recited in claim 6, wherein the resistors are coupled to a separate power supply.

8. The method as recited in claim 3, wherein the identifying further comprises ignoring floating transistor gates that do not conduct currents above a predetermined threshold.

* * * * *